United States Patent [19]
Schweitzer et al.

[11] Patent Number: 5,203,659
[45] Date of Patent: Apr. 20, 1993

[54] DIE PRESENTATION SYSTEM FOR DIE BONDER

[75] Inventors: Karl Schweitzer, Mitte; Gerhard Zeindl, Munster, both of Austria

[73] Assignee: Emhart Inc., Newark, Del.

[21] Appl. No.: 896,495

[22] Filed: Jun. 2, 1992

Related U.S. Application Data

[63] Continuation of Ser. No. 661,915, Feb. 27, 1991, abandoned.

[30] Foreign Application Priority Data

Mar. 16, 1990 [GB] United Kingdom ............... 9006036

[51] Int. Cl.$^5$ ............................................. B25J 9/04
[52] U.S. Cl. ................................. 414/226; 414/331; 414/DIG. 7; 414/744.8
[58] Field of Search ............... 414/222, 224, 225, 226, 414/744.2, 744.3, 331, DIG. 7, 744.8

[56] References Cited

U.S. PATENT DOCUMENTS

| | | | |
|---|---|---|---|
| 3,534,862 | 10/1970 | Shambelan | 206/332 X |
| 3,572,519 | 3/1971 | Tezuka | 414/744.3 X |
| 3,894,671 | 7/1975 | Kulicke | 228/4.8 |
| 4,527,936 | 7/1985 | Hartlieb | 414/744.2 X |
| 4,563,664 | 3/1987 | Hineno | 221/3 |
| 4,817,795 | 4/1989 | Kos | 206/334 X |
| 5,007,784 | 4/1991 | Genov et al. | 414/225 |

FOREIGN PATENT DOCUMENTS

| | | | |
|---|---|---|---|
| 0130498 | 1/1985 | European Pat. Off. | |
| 2724704 | 12/1977 | Fed. Rep. of Germany | 414/225 |
| 3338994 | 5/1984 | Fed. Rep. of Germany | 414/331 |

Primary Examiner—Michael S. Huppert
Assistant Examiner—Donald W. Underwood
Attorney, Agent, or Firm—Spencer T. Smith

[57] ABSTRACT

A die presentation package exchange system for use in a hybrid die bonder, in particular an automatic hybrid die bonder, which system comprises a magazine (10) for storing a plurality of die presentation packages (12). The system further comprises a clamp assembly (40), adapted to collect a selected die presentation package (12) from the magazine (10) and feed it to a die eject station (204) of the die bonding machine. The clamp assembly (40) is further adapted to retrieve the die presentation package (12) from the die eject station (204) after a predetermined number of dice have been ejected, and return it to the magazine (10). The magazine (10) further comprises indexing structure for indexing movement of the packages (12) within the magazine (10) so that the selected package is located at a collection point for collection from the magazine (10). The system further comprises indexing structure for indexing rotation of the clamp assembly (40) about its axis (62). The die presentation package exchange system makes it possible to change from one die presentation package to another with minimum delay, and consequently minimum loss in production time.

3 Claims, 4 Drawing Sheets

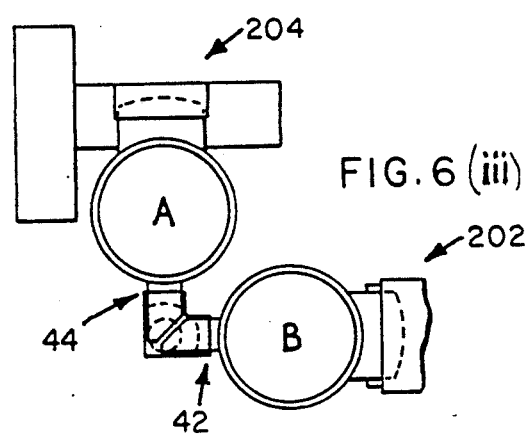
FIG. 6(iii)

DIE PRESENTATION SYSTEM FOR DIE BONDER

This is a continuation of copending application Ser. No. 07/661,915 filed on Feb. 27, 1991, abandoned.

BACKGROUND OF THE INVENTION

The present invention relates to a die presentation system for a hybrid die bonder, in particular an automatic hybrid die bonder.

A hybrid die bonder is used for bonding semiconductor dice of a range of different types and, in particular, sizes to a substrate. At the die presentation stage, dice are presented one at a time to a die eject head, for ejection and subsequent retrieval by an appropriate pick-up tool. A number of different die presentation systems are known and used, and the choice of die presentation system is determined principally by the size of the die. Available die presentation systems include for example wafer rings, film frames and waffle packs, each of which is available in different sizes.

In automatic hybrid die bonding, it is necessary for the machine to be able to handle a number of different sizes or types of dice with as short as possible an interval, and consequent loss of operating time of the machine, when changing from handling one size or type of die to another.

Known die presentation systems include wafer rings, film frames and waffle packs; each individual wafer, frame or pack contains dice of only one type or size, so that when during bonding it is necessary to change from one die type or size to another, it is also necessary to change to a different die presentation package, although it may be a similar type of package, the only difference being in the dice presented. In known hybrid die bonding machines, the die presentation packages are changed manually with consequent loss of production.

It is an object of the present invention to provide a die presentation system in which the above disadvantages are reduced or substantially obviated.

BRIEF SUMMARY OF THE INVENTION

The present invention provides a die presentation package exchange system for use in a hybrid die bonding machine, in particular an automatic hybrid die bonding machine. The die presentation package exchange system according to the present invention comprises (a) a magazine for storing a plurality of die presentation packages (b) clamp assembly rotatable about an axis, comprising first and second clamp means mounted on a rotatable support, each of said clamps being adapted to collect a selected die presentation package from said magazine, feed it to a die eject station of said die bonding machine, retrieve it from the die eject station after a predetermined number of dice have been ejected and return it to said magazine (c) indexing means for indexing movement of the packages within the magazine (a) so that the selected package is located at a collection point for collection from the magazine and (d) indexing means for indexing rotation of the clamp assembly (b) about its axis.

BRIEF DESCRIPTION OF THE DRAWINGS

A preferred embodiment of a die presentation package system according to the invention will now be further described with reference to the accompanying drawings in which.

DETAILED DESCRIPTION

Figure 2:
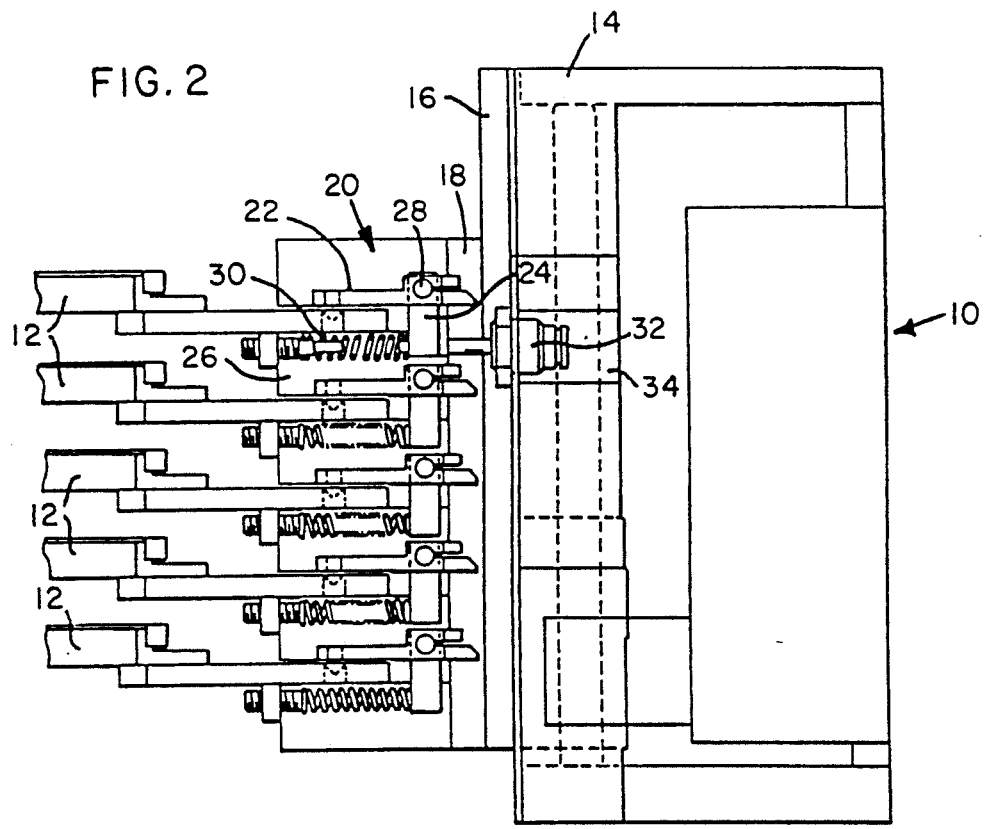
FIG. 2 is a view, in section, of a magazine for storing a plurality of die presentation packages.

A magazine (10) as shown in FIG. 2 comprises a storage and supply magazine for five or more die presentation packages (12). The magazine (10) comprises a fixed framework (14), one wall of which comprises a connector plate (16). A carrier plate (18) is mounted for vertical sliding movement on the connector plate (16).

Figure 1:
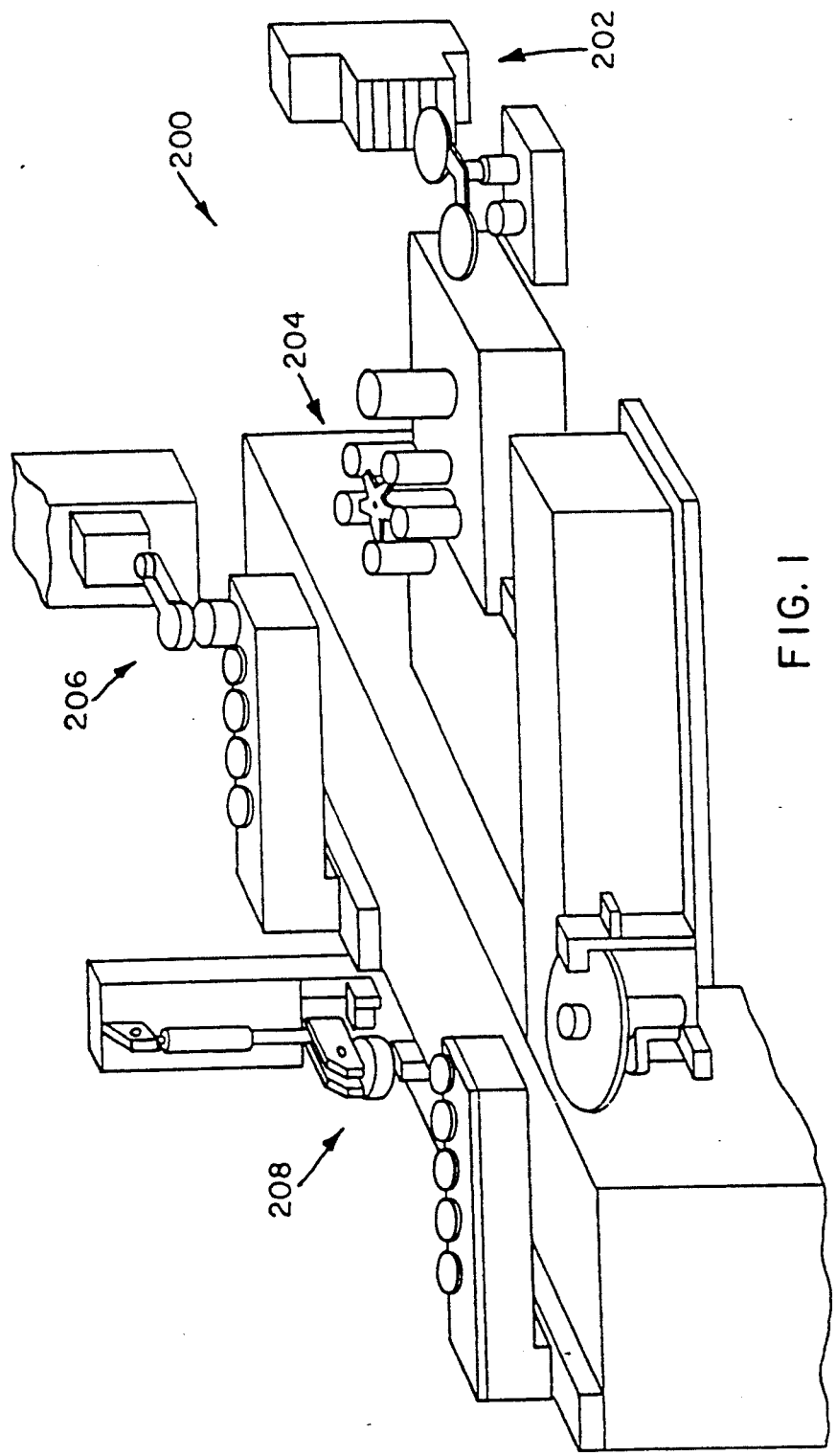
FIG. 1 is a general view of an automatic hybrid die bonding machine.

A plurality of clamp assemblies (20), one for each die presentation package, are mounted vertically one above each other on the carrier plate (18). Each of these clamp assemblies (20) comprises a clamp lever (22), lever stop (24) and support plate (26). The clamp lever (22) is mounted so that it is rotatable about a shaft (28) between a clamping position, as shown in FIG. 1 in which it clamps the die presentation package (12) and a release position (not shown) in which it releases the die presentation package. The clamp lever (22) is biased by a compression spring (30) towards the clamping position. The lever stop (24) limits the rotatory movement of the clamp lever (22). The compression spring (30) is mounted within the support plate (26).

A cylinder (32) is located within a housing (34) mounted to one side of the fixed framework (14). The operation of the magazine (10) will be described in more detail hereinafter.

Figure 3:
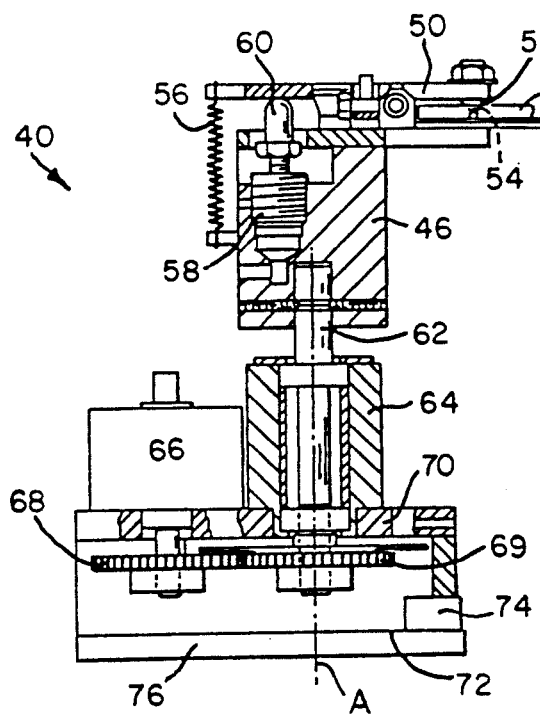
FIG. 3 is a view, in section of a rotary clamp unit.
Figure 4:
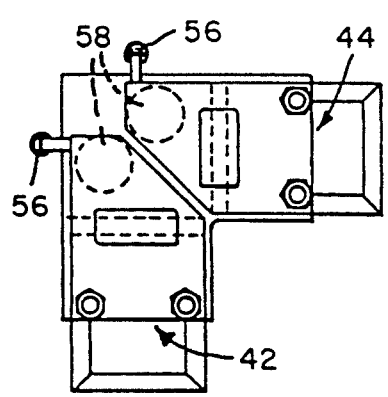
FIG. 4 is a plan view of the rotary clamp unit of FIG. 3.

As is shown in FIGS. 3 and 4, the die presentation package exchange system further comprises a rotatable die presentation package exchange unit (40). This unit comprises a first and second clamp means (42, 44) mounted at 90° to each other on a head (46).

Each of said first and second clamp means (42, 44) comprises a clamp plate (48) on which is mounted a clamp piece (50). The clamp piece (50) is provided with two centering cones (52) which co-operate with corresponding recesses (54) on the die presentation package (12). The clamp plate (48) and clamp piece (50) are biased open by means of a spring (56).

Two short-stroke cylinders (58), each with an associated pressure piece (60), are mounted on the head (46), one beneath the first clamp means (42) and the other beneath the second clamp means (44), for closing the clamp means.

The head (46) is mounted on an axial pin (62) for rotation about a vertical axis (A) located in a housing (64). The head (46) is driven for rotation by a stepping motor (66) connected to the axial pin (62) by first and second toothed wheels (68,69).

The housing (64) is mounted on a base plate (70) beneath which the toothed wheels (68) and (69) are located. Rotation of the axial pin (62) is controlled by the stepping motor (66) and a position sensor (74).

Figure 5:
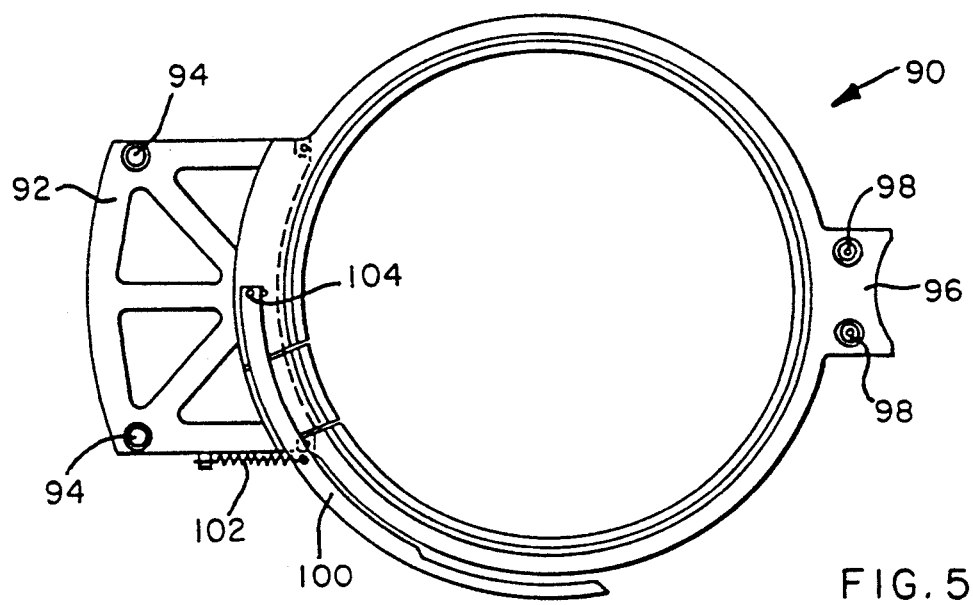
FIG. 5 is a view of a holder for die presentation packages.

As shown in FIG. 5, the die presentation package system further comprises a package holder (90) which is generally circular in shape. A flange (92) with centering recesses (94) forms an extension to one side of the circle and, on the opposite side of the circle a second flange (96) with centering recesses (98) similarly forms an extension to that side of the circle. A retaining arm (100) is mounted on the holder (94) by a pivot bolt (104) and is pulled by a spring (102) against the centre of the circle, to restrain movement of the die package.

The die presentation package exchange system forms part of an automatic hybrid die bonder (200) as shown in FIG. 1 of the accompanying drawings. The die bonder briefly comprises a die presentation package exchange system (202) according to the present invention, which presents a die presentation package to a die eject station (204) as described and claimed in our co-pending U.S. patent application Ser. No. 661,916 of even date herewith. The dice are presented to the die eject head by the presentation package, and are ejected by means of needles in the die eject head to be picked up by the tool (206, 208) of the pick-up system and taken either to the die collet mounting station.

Figure 6I:
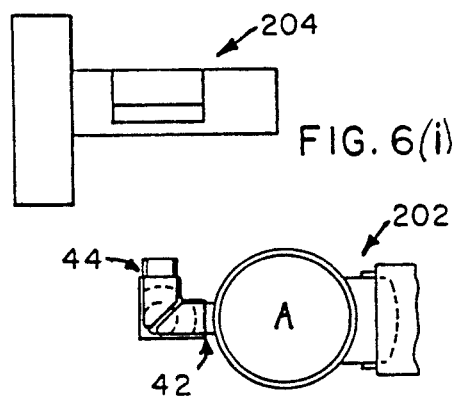
FIGS. 6(i)-6(v) are a diagrammatic representation of an operating cycle of the rotary clamp unit of FIGS. 3 and 4.
Figure 6:
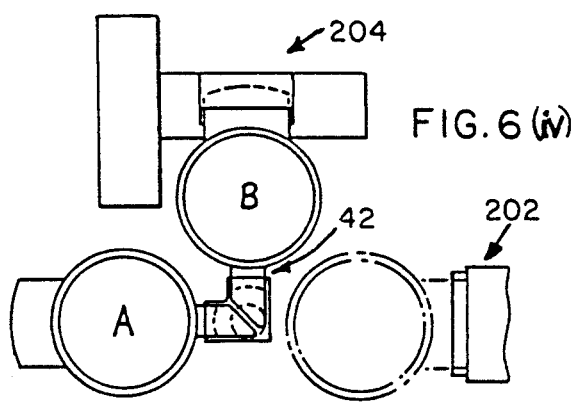
Figure 6:
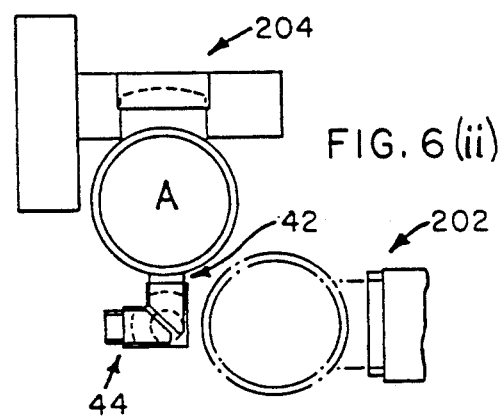
Figure 6V:
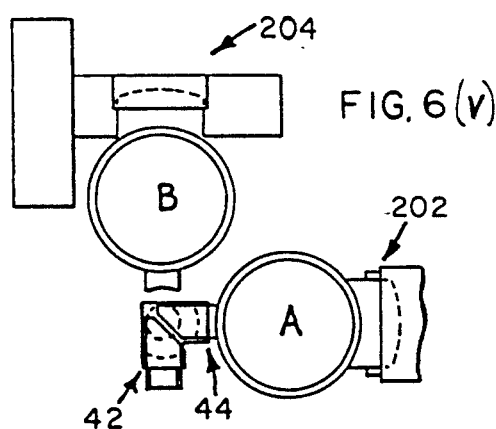

In operation, the carrier plate (18) is driven by means of a DC motor to the vertical position in which a selected die presentation package (12) is at the correct vertical location for supply to the rotatable package exchange unit (40). As shown in FIG. 6 of the accompanying drawings, the rotatable unit (40) is located in a first rotary position (i) in which a package (A) is received in the first clamp means (42) and released by the clamp assembly (20) of the magazine (10). The rotatable head is then rotated through 90° in the anti-clockwise direction to a second rotatory position (ii) at which the package (A) is received by the die eject station (204) and released by the clamp means (42). The head is then rotated through 90° in the clockwise direction so that the clamp means (42) is again aligned with the magazine (10) as in position (iii). The carrier plate (18) is simultaneously driven by the DC motor to the vertical position in which a second selected die presentation package (B) is at the correct vertical location for supply to the exchange unit (40). The package (B) is received in the first clamp means (42) and released by the clamp assembly of the magazine (10).

The unit is then held in this orientation until the predetermined number of dice have been removed from the package (A). The package (A) is then picked up by the clamp assembly (44), the head is rotated through 90° in the anti-clockwise direction (position iv) and the package (B) is then supplied to the die eject station. The head is then rotated through a further 180° in the anti-clockwise direction to return package (A) to the magazine, (position v) which has been driven to the correct vertical location for package (A) to be returned to its correct clamp assembly (20). The cycle is then repeated as required from position (iii) to position (v).

By following the operating cycle described above, it is possible to operate a hybrid die bonder with very much reduced down time between bonding different types of dice.

We claim:

1. A die presentation system comprising
   a plurality of die presentation packages,
   a magazine including means for horizontally supporting said packages vertically one above the other,
   means for guiding said magazine for vertical displacement to locate any one of said supported packages at a pick up/deposit location,
   means for picking up/depositing a package at said pick up/deposit location including
   means for horizontally mounting one of said packages,
   said mounting means being rotatable about a vertical axis,
   means for rotatably displacing said mounting means to said pick up/deposit location,
   said mounting means including a clamping element movable vertically from a remote position where said mounting means can be horizontally, rotatably displaced to said pick up/deposit location to pick up a package supported at said pick up/deposit location, to an operative position for clamping a package, and
   said supporting means including a clamping element for each of said supported packages movable vertically from a remote position where said mounting means can rotatably, horizontally displace a clamped package to said pick up/deposit location, to an operative position for clamping a package located at said pick up/deposit location.

2. A die presentation system according to claim 1, wherein said picking up/depositing means includes a pair of 90° related mounting means.

3. A die presentation system according to claim 1, wherein said rotatably displacing means comprises a stepping motor.

* * * * *